United States Patent
Kodama

[11] Patent Number: 5,612,561
[45] Date of Patent: Mar. 18, 1997

[54] INVOLATILE SEMICONDUCTOR MEMORY

[75] Inventor: Noriaki Kodama, Tokyo, Japan

[73] Assignee: NEC Corporation, Tokyo, Japan

[21] Appl. No.: 359,837

[22] Filed: Dec. 20, 1994

[30] Foreign Application Priority Data

Dec. 22, 1993 [JP] Japan .................................. 5-323839

[51] Int. Cl.$^6$ ................................................. H01L 29/76
[52] U.S. Cl. .......................... 257/314; 257/315; 257/316; 257/336; 257/344; 257/408
[58] Field of Search .................................... 257/314, 315, 257/316, 336, 344, 408

[56] References Cited

U.S. PATENT DOCUMENTS 5,386,136  1/1995  Williams et al. ........................ 257/344

OTHER PUBLICATIONS

M. Ohi et al., "An Asymmetrical Offset Source/Drain Structure for Virtual Ground Array Flash Memory with DINOR Operation", Symposium on VLSI Technology, 1993, pp. 57–58.

Primary Examiner—Edward Wojciechowicz
Attorney, Agent, or Firm—Foley & Lardner

[57] ABSTRACT

There is provided an involatile semiconductor memory deice comprising a virtual ground memory cell array which allows the read current to be increased without degrading the writing characteristic. A source/drain of a memory cell having a floating gate 3 is composed of a double diffusion layer comprising an n$^-$-type diffusion layer 7 and an n$^+$-type diffusion layer 8, the n$^+$-type diffusion layer 8 overlaps with one end of the floating gate 3 and the other is provided with an offset of the n$^-$-type diffusion layer 7.

2 Claims, 5 Drawing Sheets

INVOLATILE SEMICONDUCTOR MEMORY

FIELD OF THE INVENTION

The present invention relates to an involatile semiconductor memory device and, in particular, to an involatile semiconductor memory device comprising field effect transistors each having a floating gate as memory cells, which are electrically rewritable.

BACKGROUND OF THE INVENTION

In recent years, many innovative technologies and new cell structures for high concentration flash memories have been published for instance contactless cell array with F-N tunneling erase/write operation.

FIG. 5 illustrates a cross-sectional view of a conventional involatile semiconductor memory device. Incidentally, this is described in a literature named "An Asymmetrical Offset Source/Drain Structure for Virtual Ground Array Memory with DINOR Operation" by "Symposium on VLSI Technology", pp 57–58, 1993. As shown FIG. 5, in this conventional involatile semiconductor memory device, a composite gate is provided on the surface of a p-type semiconductor substrate 1, on which a first gate insulating film 2, a floating gate 3, a second gate insulating film 4 and a control gate 5 are each sequentially layered.

Further, in the conventional involatile semiconductor memory device, an $n^+$-type diffusion layer 8 is provided on the surface of the p-type semiconductor substrate 1, the $n^+$-type diffusion layer 8 overlapping with the end of one adjacent floating gate 3 and being spaced apart from the other end of the floating gate 3 by a non-doped offset area 6. The control gates 5 are interconnected to form a word line, and the $n^+$-type diffusion layer 8 is formed as a bit line/source line, to form a memory cell array.

As described above, in the memory cell array, the diffusion layer of the source or drain of the adjacent memory cells are integrally formed with the diffusion layer extending perpendicular to the direction in which the channel of the memory cell extends taken as the bit line/source line and with the control gate interconnected in the direction in which the channel of the adjacent memory cell extends to form the word line, and it is called a "virtual ground memory cell array". The advantage of this virtual ground memory cell array is that the bit line is arranged with the diffusion layer and that no contact is necessary to connect the drain and the bit line to each memory cell unlike the case in which the bit line is arranged with the metallic line, which allows the area of the memory cell to be made small.

Referring now to an equivalent circuit of the virtual ground memory array of FIG. 6, erasure, writing and reading operations of the virtual ground memory cell array are described.

A erasure operation of the memory cell is conducted for each word line and is operated by the next described sequence. (1) A positive high voltage is applied to a selected word line, for example, $W_1$. (2) Electron is injected from the p-type semiconductor substrate 1 to the floating gate 3 through the first gate insulating film 2 in the form of a Fowler Nordheim tunnel (hereinafter referred to as "F-N tunnel") to set the threshold voltage of the memory cells $M_{i, k-1}$, $M_{i, k}$, $M_{i, k+1}$ on the selected word line $W_i$ to, for example, about 5 V.

A writing operation into the memory cell $M_{i, k}$ is conducted in the following sequence. (1) A negative voltage of, for example, −9 V is applied to the word line $W_i$. (2) Other word lines $W_{i-1}$, $W_{i+1}$ are set to the ground potential. (3) A positive voltage of, for example, 5 V as a writing data of the memory cell $M_{i, k}$ is applied to the bit line $b_k$. (4) Other bit lines $b_{k-1}$, $b_{k+1}$, $b_{k+2}$ are set to the floating potential. (5) The electron accumulated to the floating gate of the memory cell $M_{i, k}$ are discharged the way of the F-N tunnel to the bit line $b_k$ through the F-N tunnel, and the threshold voltage of the memory cell $M_{i, k}$ is set to, for example, about 1 V.

Incidentally, during this writing, since there is an offset between the floating gate and the bit line $b_k$ of the adjacent memory cells $M_{i, k-1}$, neither the electrons of the floating gate of the memory cell $M_{i, k-1}$ discharged to the bit line $b_k$ through the FN tunnel, nor is written to the memory cell $M_{i, k-1}$.

A reading operation of the memory cell $M_{i, k}$ is conducted in the following sequence. (1) A power source voltage Vcc of, for example, 3 V is a applied to the word line $W_i$. (2) Other word lines $W_{i-1}$, $W_{i+1}$ are set to the ground potential. (3) The bit line $b_k$ is set to the ground potential. (4) The reading voltage of, for example, 1 V is applied to the bit line $b_{k+1}$. (5) Other bit lines $b_{k-1}$, $b_{k+2}$ are set to the floating potential. (6) The data of the memory cell $M_{i, k}$ is read from the bit line $b_{k+1}$.

Incidentally, in a conventional involatile semiconductor memory device having the virtual ground memory cell array, during the reading operation, a resistance element made of an impurity which lies at the side of the drain of the drain cell is added to the non-doped offset area 6, and the reading current becomes small. Therefore the reading current becomes small, then it becomes impossible to read data at a fast speed.

SUMMARY OF THE INVENTION

Accordingly, an object of the present invention is to provide an involatile semiconductor memory device which allows the reading current to be increased without degrading the writing characteristic.

In the involatile semiconductor memory device comprising a virtual ground memory cell array according to the present invention, one of the diffusion layers which serves as the source or drain of the memory cell, which has a higher density of impurity, is overlapped with the end of the floating gate,and the other is formed spaced apart from the end of the floating gate through the diffusion layer of low impurity density.

In addition, the low threshold value (to be able to write) in which the electron becomes empty at the floating gate is achieved by applying a positive voltage to a selected bit line connected to the source or drain of high impurity density of the selected memory cell, applying a negative voltage to a selected word line connected to the control gate of the selected memory cell and discharging the electrons accumulated to the floating gate of the selected memory cell to the source or drain of high impurity density via a first gate insulating film.

In the involatile semiconductor memory device according to the present invention, since there is no offset area, which is not doped with the impurity, at the source and drain of the memory cell, the high resistance portion is eliminated between the source and the drain. As a result, a high reading current can be obtained.

Further, since the reading operation is achieved by discharging the electrons accumulated to the floating gate to the diffusion layer of high impurity density which is overlapped with the floating gate through the F-N tunnel, no degradation of the reading operation occurs.

BRIEF DESCRIPTION OF THE ACCOMPANYING DRAWINGS

Figure 4:
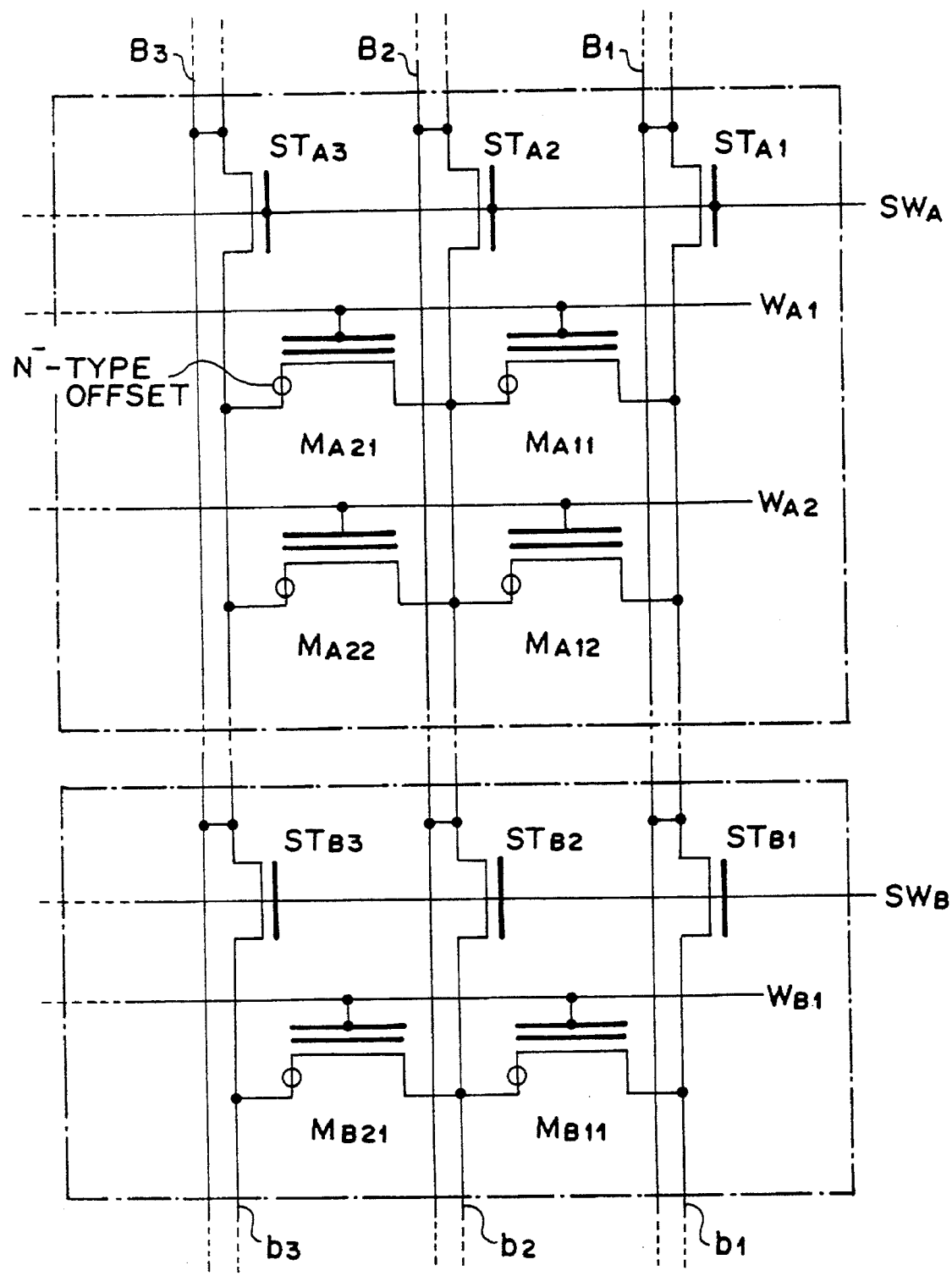
Figure 5:
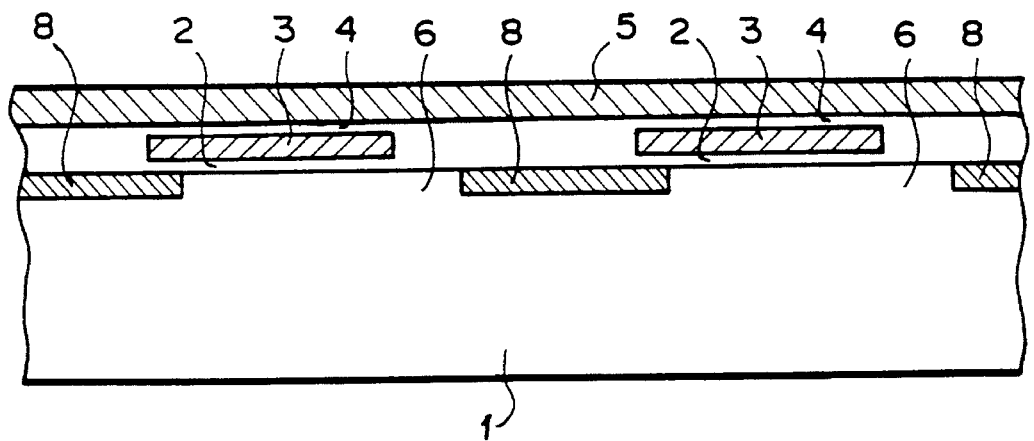
Figure 6:
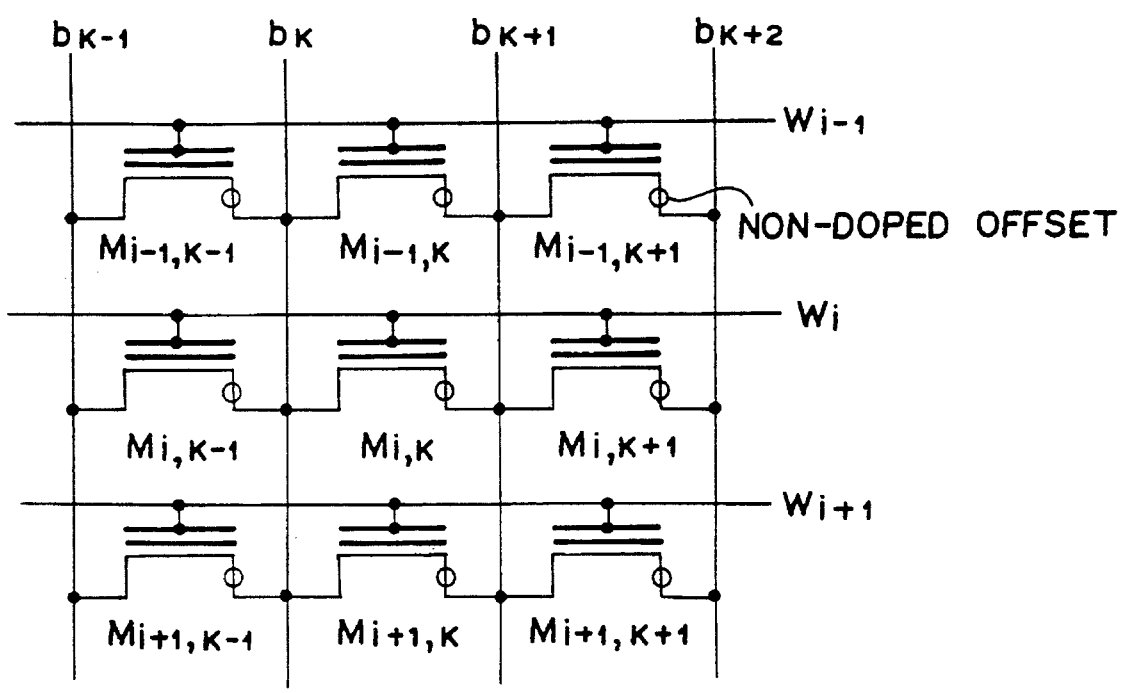

FIG. 3(a) through 3(h) is a view of a specific example of the manufacturing process of the involatile semiconductor memory device of the present invention;

FIG. 4 is an equivalent circuit diagram of the specific example of the present invention;

FIG. 5 is a view illustrating a cross-section of a conventional involatile semiconductor memory device; and FIG. 6 is an equivalent circuit diagram of the conventional involatile semiconductor memory device.

DESCRIPTION OF THE PREFERRED EMBODIMENTS OF THE INVENTION

Figure 1:
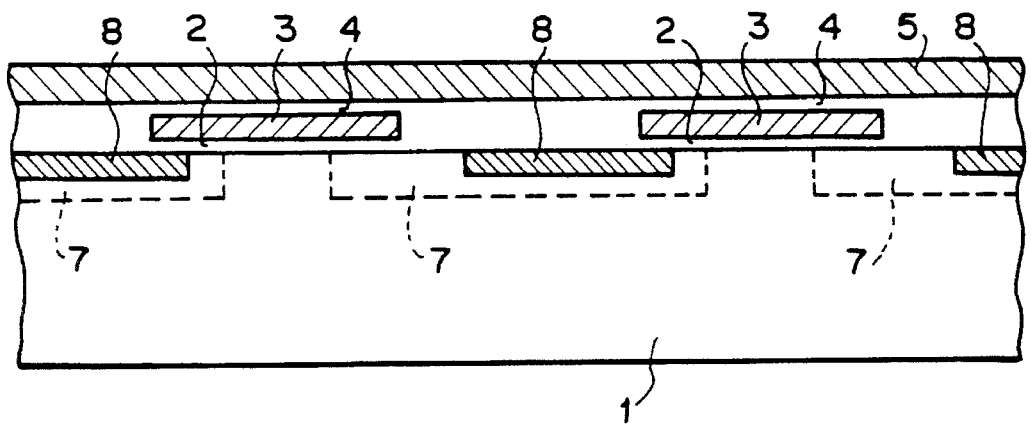
FIG. 1 is a view illustrating a cross-sectional arrangement of a specific embodiment of the present invention.

FIG. 1 illustrates a cross-sectional view of a specific embodiment of the present invention.

Herein, there is a composite gate on the surface of a p-type semiconductor substrate 1, on which a first gate insulating film 2, a floating gate 3, a second gate insulating film 4 and a control gate 5 are sequentially laminated. Further, there are an $n^-$-type diffusion layer 7 of low n-type impurity density which overlaps with the ends of both adjacent floating gates 3 and an $n^+$-type diffusion layer 8 of high n-type impurity density which overlaps with the end of one adjacent floating gate 3 and which is spaced apart from the end of the other floating gate 3 by $n^-$-type-offset on the surface of the p-type semiconductor substrate 1. The adjacent control gate 5 is connected in the direction in which the channel of the memory cell extends to form a word line, and an $n^-$-type diffusion layer 7 and an $n^+$-type diffusion layer 8, which extend perpendicular to the direction in which the channel of the memory cell extends are used as the bit line/source line to form a memory cell array.

A erasure, writing and reading operations of the memory cell array according to the present invention are hereinafter described. Referring to the state of the memory cell, the high threshold value state in which electron are accumulated to the floating gate 3 is set to "0" level, and the state in which the electron of the floating gate 3 is empty is set to "1" level.

The erasure operation to set the memory cell to "0" level is achieved for each word line. (1) All the bit lines/source lines are set to the open or ground potential. (2) A positive high voltage is applied to the selected word line. (3) Electrons are injected to the floating gate 3 from the p-type semiconductor substrate 1 through the first gate insulating film 2 for accumulation through the F-N tunnel.

The writing operation to set the memory cell to "1" level is conducted in the following manner. (1) A programed gate voltage of, for example, about −9 V is applied to the word line $W_{An}$, connected to a selected memory cell (hereinafter referred to as "selected cell"). (2) Other word lines are set to the ground potential. (3) A program drain voltage of, for example, about 5 V is applied to the bit line/source line (hereinafter referred to as "selected bit line/source line") at the side of the $n^+$ diffusion layer which overlaps with the floating gate of the selected cell. (4) Other bit lines/source lines are set to the ground potential. (5) The electron accumulated to the floating gate 3 are discharged to the selected bit line/source line through the first gate insulating film 2 through F-N tunnel.

Incidentally, during this writing operation, the floating gate 3 of the memory cell (hereinafter referred to as "adjacent cell") which is adjacent to the selected cell with the selected bit line/source line, to which the program drain voltage is applied, interleaved therebetween, does not overlap with the $n^+$-type diffusion layer of the selected bit line/source line, but overlap with the $n^-$-type diffusion layer. Therefore, the electric field applied to the first gate insulating film 2 between the floating gate 3 of the adjacent cell and the selected bit line/source line is alleviated, and no F-N tunnel leading from the floating gate of the adjacent cell to the selected bit line/source line is induced and no data is written on the adjacent cell. Therefore the data of the selected bit line/source line is written to the selected cell.

The reading operation of the memory cell is conducted in the following manner. (1) A power source voltage $V_{cc}$ of, for example, about 3 V is applied to the word line connected to the selected cell. (2) Other word lines are set to the ground potential. (3) The selected bit line/source line is set to the ground potential to make it serve as the source. (4) A read drain voltage is applied to the bit line/source line opposed to the selected bit line/source line with the floating gate interleaved therebetween to make it serve as the drain. (5) Other bit lines/source lines are set to the open potential. Therefore the data of the selected cell is read out from the bit line/source line.

Figure 2:
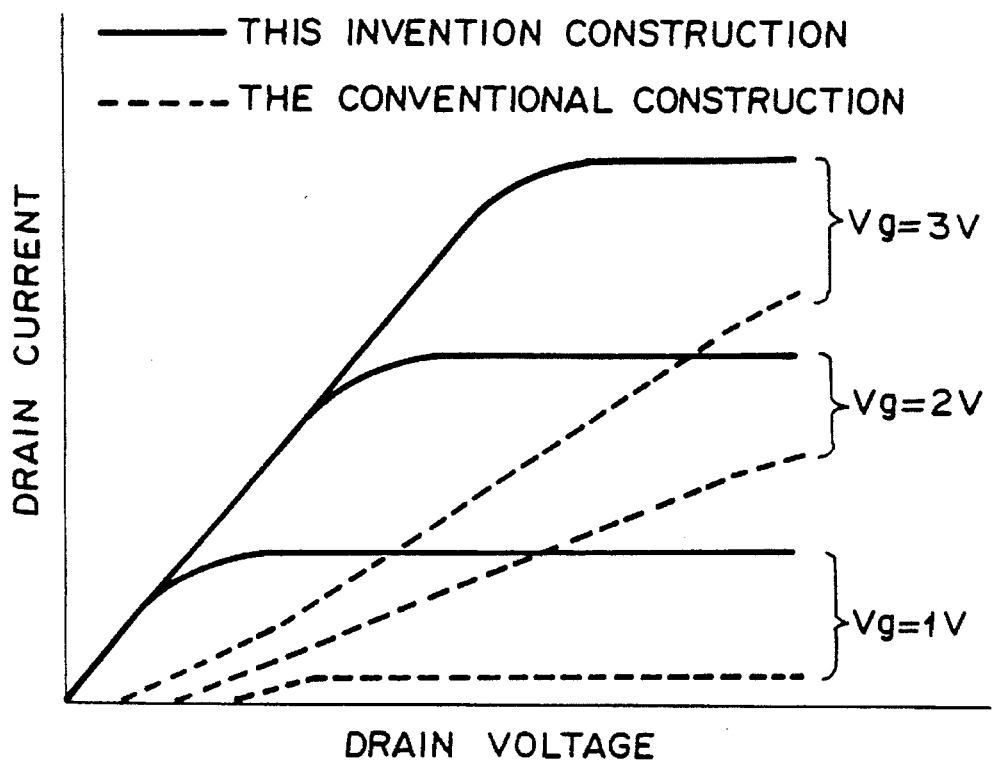
FIG. 2 is a view illustrating a reading current characteristic of a memory cell according to a arrangement of the present invention and a conventional arrangement.
Figure 3A:
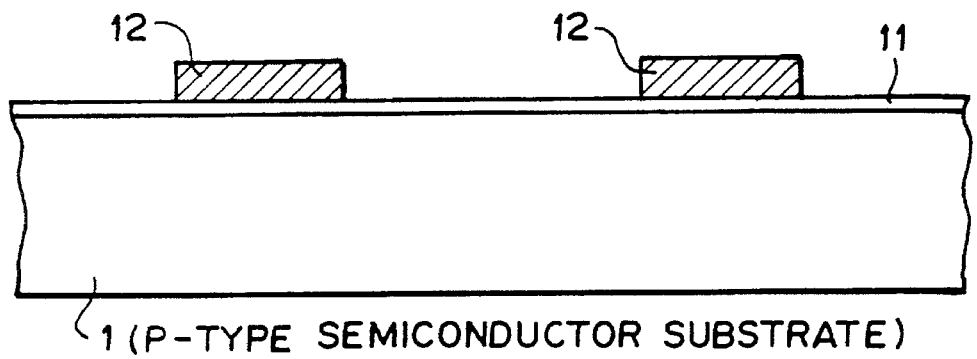
Figure 3B:
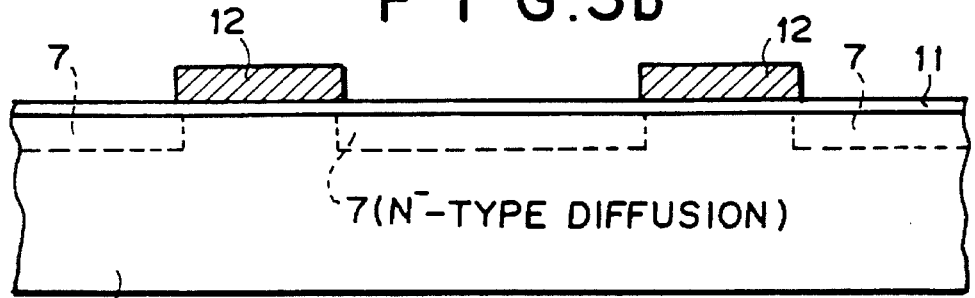
Figure 3C:
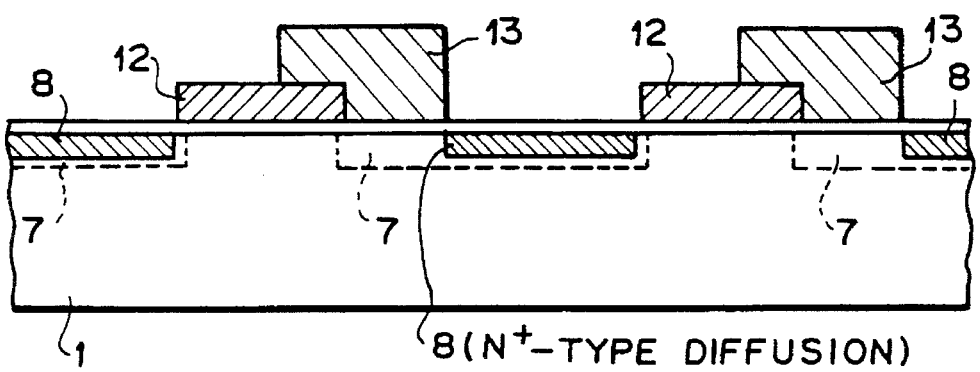
Figure 3D:
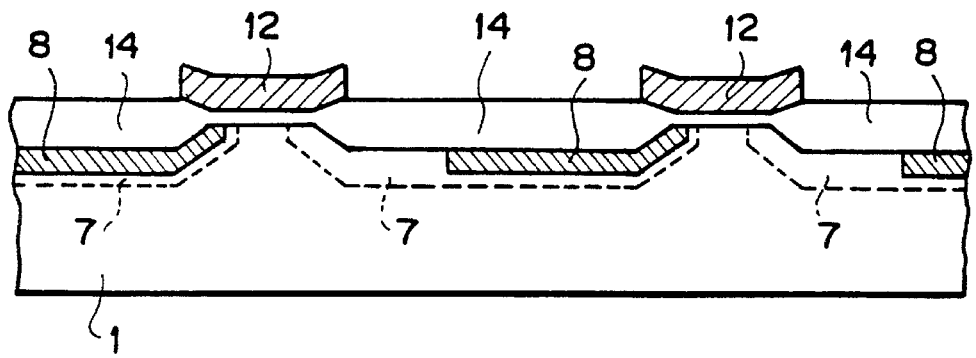
Figure 3E:
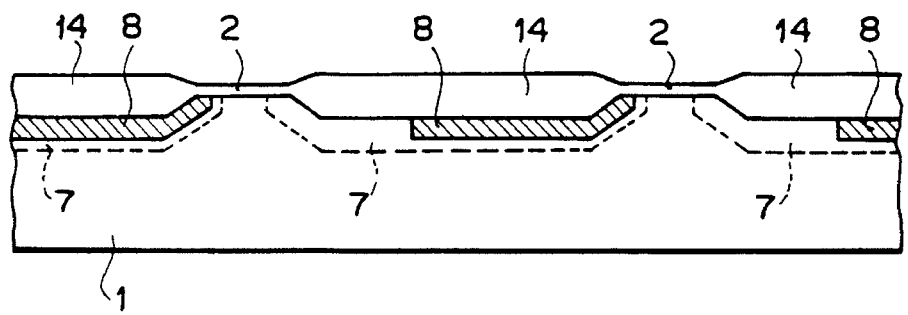
Figure 3F:
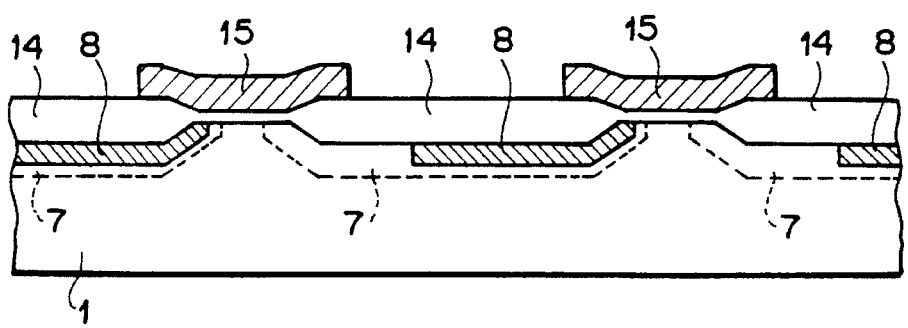
Figure 3G:
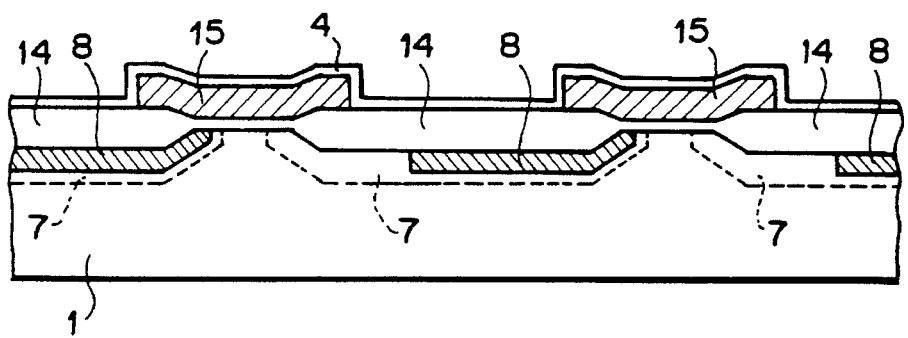
Figure 3H:
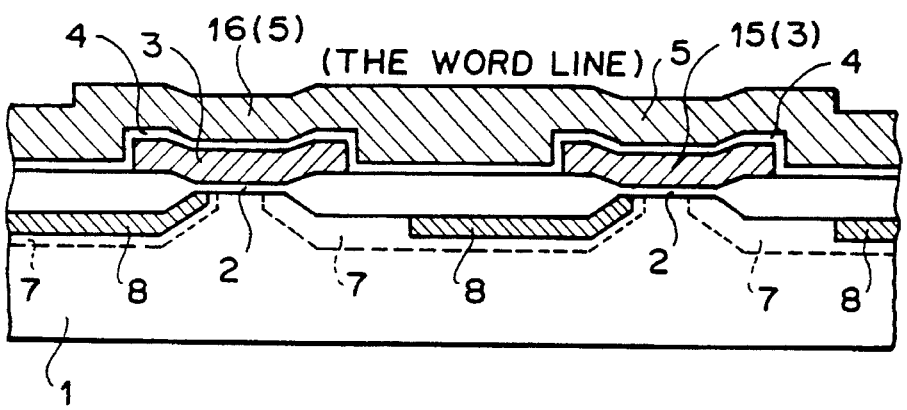

As described above, in the arrangement of the present invention, the $n^-$-type diffusion layer is formed at the offset area lying between the $n^+$-type diffusion layer, which turns into the drain side during the reading operation, and the floating gate. Therefore, a high read current can be achieved as compared with the conventional case in which that portion is not doped. The read current characteristics according to the arrangement of the present invention and the conventional arrangement are illustrated in FIG. 2, in which the horizontal axis plots the drain voltage, and the vertical axis plots the drain current. The solid lines plot the read current characteristic according to the arrangement of the present invention, an the broken lines plot the reading current characteristic according to the conventional arrangement, each illustrating the cases of the gate voltage V=1 V, 2 V and 3 V.

Here, a specific example of the manufacturing process of the involatile semiconductor memory device of the present invention is described with reference to FIG. 3(a) through FIG. 3(h).

(a) A pad oxide film 11 is formed on the surface of the p-type semiconductor substrate 1, and a nitride film 12 is selectively formed thereon.

(b) The nitride film 12 mask, and an n-type impure ions, for example, phosphor is ion-implanted to the surface of the p-type semiconductor substrate 1 to form an $n^-$-type diffusion layer 7 of low concentration.

(c) A photoresist 13 patterned so as to cover one end of the nitride film 12 is used as a mask to ion-implant n-type impure ions, for example, arsenic (As), on the surface of the p-type semiconductor substrate 1 to form an $n^+$-type diffusion layer 8 of high concentration. Incidentally, one end of the $n^+$ diffusion layer 8 is adjacent to the nitride film 12, and the other end is offset from the adjacent nitride film 12.

(d) Photoresist 13 is erased, and the surface of the p-type semiconductor substrate 1 is selectively oxidized with the nitride film 12 used as the mask, to form a field oxide film 14. At this time, the n⁻-type diffusion layer 7 and the n⁺-type diffusion layer 8 are embedded below the field oxide film 14.

(e) The pad oxide film 11 lying below the nitride film 12 and the nitride film 12 is removed, and a first gate insulating film 2 is deposited on the surface of the type semiconductor substrate 1 which is surrounded with the field oxide film 14.

(f) A first electrically conductive layer 15 is deposited on the surface of the first gate insulating film 2 and the field oxide film 14 to pattern on the first gate insulating film 2 in the form of strips.

(g) A second gate insulating film 4 is deposited so as to cover the first electrically conductive layer 15 as the entire floating gate 3.

(h) A second electrically conductive layer 16 is deposited so as to cover the second gate insulating film 4. The second electrically conductive layer 16, second gate insulating film 4 and the first electrically conductive layer 15 are sequentially selectively etched and patterned to form a control gate 5 of each memory cell serving as a word line at the second electrically conductive layer 16 extending perpendicular to the n⁻-type diffusion layer 7 and the n⁺-type diffusion layer 8 (in the direction in which the channel extends), to form the floating gate 3 of each memory cell at the first electrically conductive layer 15.

Thereafter, p-type impure ions comprising, for example, boron or the like, are implanted into the surface of the patterned and exposed p-type semiconductor substrate 1 to form a p-type diffusion layer to separate between the memory cells electrically.

FIG. 4 illustrates an arrangement of the equivalent circuit according to the embodiment of the present invention.

In FIG. 4, memory cells $M_{A11}$, $M_{M12}$, $M_{A21}$, $M_{A22}$, . . . and memory cells $M_{B11}$, $M_{B12}$, . . . , are each separated by writing and erasing blocks. Source/drain of each memory cell M is connected to subsidiary lines/source lines $b_1$, $b_2$, $b_3$ each formed with the diffusion layer and, further, the main bit lines/source lines $B_1$, $B_2$, $B_3$ each formed with a metallic line layer are connected thereto via the selected transistors $ST_{A1}$, $ST_{A2}$, $ST_{A3}$, . . . , $ST_{B1}$, $ST_{B2}$, $ST_{B3}$, . . . . n⁻-type-offset of the source/drain of each memory cell M is connected to the subsidiary bit line/source line b in a certain direction. Further, the control gate of each memory cell M is connected to the word lines $W_{A1}$, $W_{A2}$, $W_{B1}$. Each selected transistor ST provided on the subsidiary bit/source line b for each block which writes and erases is each controlled by the selected word lines $SW_A$, $SW_B$.

When data is rewritten, the selected word line SW of the selected transistor ST of the selected block is set to the high potential, and the selected word line SW of the selected transistor ST of the non-selected block is set to the low potential, so that the voltage of the main bit/source line B is applied to only the subsidiary bit/source line of the selected block. As a result, the voltage of the main bit/source line B which is involved with rewriting is not applied to the memory cell M of the non-selected block which is separated by the selected transistor ST, and it does not happen that the data of the memory cell M of the non-selected block is rewritten by accident.

As described above, according to the involatile semiconductor memory device of the present invention, since there is no impure non-doped offset area at the source drain of the memory cell, a high read current can be achieved. Therefore, it becomes possible to increase the reading speed.

While this invention has been particularly shown and described with reference to the preferred embodiment thereof, it will be understood that various changes in form and details may be made therein without departing from the spirit and scope of the invention.

What is claimed is:

1. A involatile semiconductor memory device comprising a virtual ground memory cell array wherein a composite gate having a first gate insulating film, a floating gate, a second gate insulating film and a control gate sequentially laminated on the surface of a semiconductor substrate is formed on the surface of a semiconductor substrate, a bit/source line being formed by a diffusion layer (integrally formed by diffusion layers of source or drain of adjacent memory cells) extending perpendicular to the direction in which the channel extends, a word line being formed by connecting the control gate in the direction in which the channel of the adjacent memory cells extends;

one of said diffusion layers which serves as a source or a drain of said memory cell is high in impurity density and overlaps with the end of said floating gate, and the other is formed from the end of said floating gate spaced apart from a diffusion layer of low impurity density.

2. A involatile semiconductor memory device as set forth in claim 1 wherein a positive voltage is applied to said selected bit line connected to the highly impure source or drain of a selected memory cell, a negative voltage is applied to said selected word line connected to the control data of said selected memory cell, electrons accumulated to the floating gate of said selected memory cell are discharged to the highly impure source or drain through said first gate insulating film to set the selected memory cell to a low threshold value level.

* * * * *